United States Patent
Flammer, III

(10) Patent No.: US 9,214,836 B2
(45) Date of Patent: Dec. 15, 2015

(54) POWER GRID TOPOLOGY DISCOVERY VIA TIME CORRELATION OF PASSIVE MEASUREMENT EVENTS

(71) Applicant: Silver Spring Networks, Inc., Redwood City, CA (US)

(72) Inventor: George H. Flammer, III, Cupertino, CA (US)

(73) Assignee: Silver Spring Networks, Inc., Redwood City, CA (US)

( * ) Notice: Subject to any disclaimer, the term of this patent is extended or adjusted under 35 U.S.C. 154(b) by 517 days.

(21) Appl. No.: 13/669,423

(22) Filed: Nov. 5, 2012

(65) Prior Publication Data

US 2014/0012524 A1    Jan. 9, 2014

Related U.S. Application Data

(60) Provisional application No. 61/668,410, filed on Jul. 5, 2012.

(51) Int. Cl.
| | | |
|---|---|---|
| *G06F 19/00* | (2011.01) | |
| *G01R 21/00* | (2006.01) | |
| *H02J 13/00* | (2006.01) | |
| *H02J 3/00* | (2006.01) | |

(52) U.S. Cl.
CPC .. *H02J 13/00* (2013.01); *H02J 3/00* (2013.01)

(58) Field of Classification Search
CPC ..... G01R 29/18; G01R 21/00; H02J 13/0013; H02J 3/26; Y02E 40/50; Y02E 60/7807; Y04S 40/12
USPC .............. 702/60, 61, 72, 79, 89, 122, 62
See application file for complete search history.

(56) References Cited

U.S. PATENT DOCUMENTS 8,712,711 B2 *   4/2014   Nayar et al. ............. 702/72

* cited by examiner

*Primary Examiner* — John H Le
(74) *Attorney, Agent, or Firm* — Artegis Law Group, LLP

(57) ABSTRACT

A wireless mesh network is configured to manage a power grid. Each node within the wireless mesh network is configured to detect and classify voltage fluctuations in power supplied by an upstream transformer coupled to the power grid. When a given node detects a particular type of fluctuation (i.e., an "event"), the node generates a timestamped event classification that reflects the type of event and a time when the event occurred. A server configured to manage the wireless mesh network receives timestamped event classifications from each node within the wireless mesh network and then performs a time correlation with the received timestamped event classifications to determine which nodes detected similar events. When two or more nodes detected the same event at similar times, the server determines that those nodes are coupled to the same transformer.

20 Claims, 7 Drawing Sheets

POWER GRID TOPOLOGY DISCOVERY VIA TIME CORRELATION OF PASSIVE MEASUREMENT EVENTS

CROSS-REFERENCE TO RELATED APPLICATIONS

This application claims the benefit of U.S. provisional patent application titled "Power Grid Topology Discovery via Time Correlation of Passive Measurement Events," filed on Jul. 5, 2012 and having Ser. No. 61/668,410. The entire content of the foregoing application is hereby incorporated herein by reference.

BACKGROUND OF THE INVENTION

1. Field of the Invention

Embodiments of the present invention relate generally to wireless digital communication and more specifically to power grid topology discovery via time correlation of passive measurement events.

2. Description of the Related Art

In a conventional electric power grid, high-voltage power is produced at a power station, such as a hydroelectric dam, and then conducted along power transmission lines to a power sub-station. At the power sub-station, the high-voltage power is stepped down to a medium-voltage power, which, in turn, is distributed to transformers that are dispersed geographically. Power consumers, including residences and businesses, draw power directly from such transformers.

A given transformer has a primary side that includes upstream power transmission lines, as well as a secondary side that includes power transmission lines coupled directly to power consumers. The set of power consumers coupled to a given transformer are said to reside on the secondary side of the transformer. Electric power companies typically maintain documentation specifying which power consumers reside on the secondary side of each transformer. This documentation defines the power grid topology.

Maintaining an accurate power grid topology is important to electric power companies because that topology may be used to predict loads on different parts of the power grid and to avoid safety issues related to transformer overloading, among other things. Further, the power grid topology can be used to identify unauthorized modifications to the power grid, which could also pose safety issues.

One approach to determining power grid topology involves placing a transceiver on each transformer, where a given transceiver is configured to communicate with power consumer metrology on the secondary side of the corresponding transformer using power line communication (PLC) techniques. Using PLC techniques, the transceiver associated with a given transformer attempts to identify the set of power consumers residing on the secondary side of that transformer by communicating with the associated metrology.

This approach is flawed, however, because PLC techniques are only effective over a certain distance. If a given power consumer resides sufficiently far away from the transceiver, then the metrology associated with that power consumer will not be capable of discerning the PLC signal against background noise and cannot communicate with the transceiver. As such, the transceiver located on the transformer is incapable of determining that the power consumer is coupled to that transformer, and, thus, the overall power grid topology will be inaccurate.

The drawbacks of PLC-oriented techniques for establishing power grid topology are especially pronounced in countries within the European Union, since those countries often allow a large number of power consumers to be coupled to a single transformer. Consequently, many of these power consumers reside outside of the effective range of PLC techniques, and so the topology of such power grids is at risk of being inaccurate.

As the foregoing illustrates, what is needed in the art is an improved technique for determining power grid topology.

SUMMARY OF THE INVENTION

One embodiment of the present invention sets forth a computer-implemented method for determining a topology of a power grid, including receiving a first timestamped event classification from a first node residing within a network of nodes, where the first timestamped event classification reflects an event within the power grid detected by the first node, receiving a second timestamped event classification from a second node residing within the network of nodes, where the second timestamped event classification reflects an event within the power grid detected by the second node, determining that the first timestamped event classification and the second timestamped event classification are correlated with one another, and determining that the first node and the second node are both coupled to a particular transformer within the power grid based on the first timestamped event classification and the second timestamped event classification being correlated with one another.

One advantage of the disclosed approach is that power grid topology can be reliably determined regardless of the distance between each power consumer and an upstream transformer. Accordingly, safety issues related to inaccurate power grid topology may be circumvented.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1A:
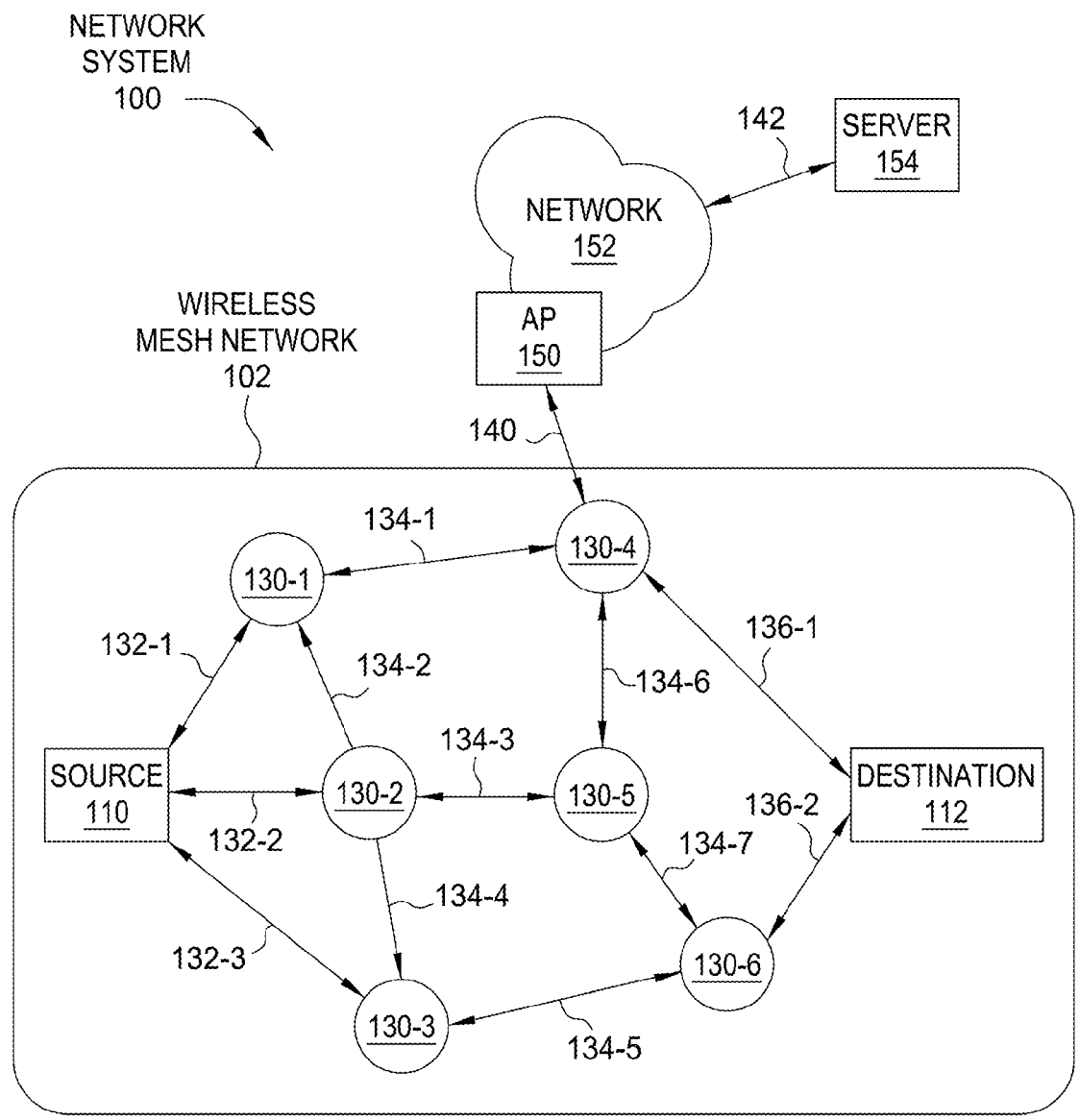
FIG. 1A illustrates a network system, according to one embodiment of the invention.

FIG. 1A illustrates a network system 100, according to one embodiment of the invention. The network system 100 includes, without limitation, a wireless mesh network 102, which may include a source node 110, intermediate nodes 130 and destination node 112. The source node 110 is able to communicate with certain intermediate nodes 130 via communication links 132. The intermediate nodes 130 communicate among themselves via communication links 134. The intermediate nodes 130 communicate with the destination node 112 via communication links 136. The network system 100 may also include an access point 150, a network 152, and a server 154.

A discovery protocol may be implemented to determine node adjacency to one or more adjacent nodes. For example, intermediate node 130-2 may execute the discovery protocol to determine that nodes 110, 130-1, 130-3, and 130-5 are adjacent to node 130-2. Furthermore, this node adjacency indicates that communication links 132-2, 134-2, 134-4 and 134-3 may be established between the nodes 110, 130-1, 130-3, and 130-5, respectively. One skilled in the art will understand that any technically feasible discovery protocol may be implemented without departing from the scope and spirit of embodiments of the present invention.

The discovery protocol may also be implemented to determine the hopping sequences of adjacent nodes, i.e. the sequence of channels across which nodes periodically receive payload data. As is known in the art, a "channel" may correspond to a particular range of frequencies. Once adjacency is established between the source node 110 and at least one intermediate node 130, the source node 110 may generate payload data for delivery to the destination node 112, assuming a path is available. The payload data may comprise an Internet protocol (IP) packet, an Ethernet frame, or any other technically feasible unit of data. Similarly, any technically feasible addressing and forwarding techniques may be implemented to facilitate delivery of the payload data from the source node 110 to the destination node 112. For example, the payload data may include a header field configured to include a destination address, such as an IP address or Ethernet media access control (MAC) address. In one embodiment, the payload data includes time-stamped event classifications that reflect events observed within an electricity distribution infrastructure managed by network system 100, including voltage spikes or dips, among others, as discussed in greater detail below in conjunction with FIGS. 3-6.

Each intermediate node 130 may be configured to forward the payload data based on the destination address. Alternatively, the payload data may include a header field configured to include at least one switch label to define a predetermined path from the source node 110 to the destination node 112. A forwarding database may be maintained by each intermediate node 130 that indicates which communication link 132, 134, 136 should be used and in what priority to transmit the payload data for delivery to the destination node 112. The forwarding database may represent multiple paths to the destination address, and each of the multiple paths may include one or more cost values. Any technically feasible type of cost value may characterize a link or a path within the network system 100. In one embodiment, each node within the wireless mesh network 102 implements substantially identical functionality and each node may act as a source node, destination node or intermediate node.

In network system 100, the access point 150 is configured to communicate with at least one node within the wireless mesh network 102, such as intermediate node 130-4. Communication may include transmission of payload data, timing data, or any other technically relevant data between the access point 150 and the at least one node within the wireless mesh network 102. For example, communications link 140 may be established between the access point 150 and intermediate node 130-4 to facilitate transmission of payload data between wireless mesh network 102 and network 152. The network 152 is coupled to the server 154 via communications link 142. The access point 150 is coupled to the network 152, which may comprise any wired, optical, wireless, or hybrid network configured to transmit payload data between the access point 150 and the server 154.

In one embodiment, the server 154 represents a destination for payload data originating within the wireless mesh network 102 and a source of payload data destined for one or more nodes within the wireless mesh network 102. In another embodiment, the server 154 executes an application for interacting with nodes within the wireless mesh network 102. For example, nodes within the wireless mesh network 102 may perform measurements to generate measurement data, such as power consumption data. The server 154 may execute an application to collect the measurement data and report the measurement data. In yet another embodiment, the server 154 queries nodes within the wireless mesh network 102 for certain data. Each queried node replies with requested data, such as consumption data, system status and health data, and so forth. In an alternative embodiment, each node within the wireless mesh network 102 autonomously reports certain data, which is collected by the server 154 as the data becomes available via autonomous reporting. Exemplary details of server 154 are described in greater detail below in conjunction with FIG. 1B.

Figure 1B:
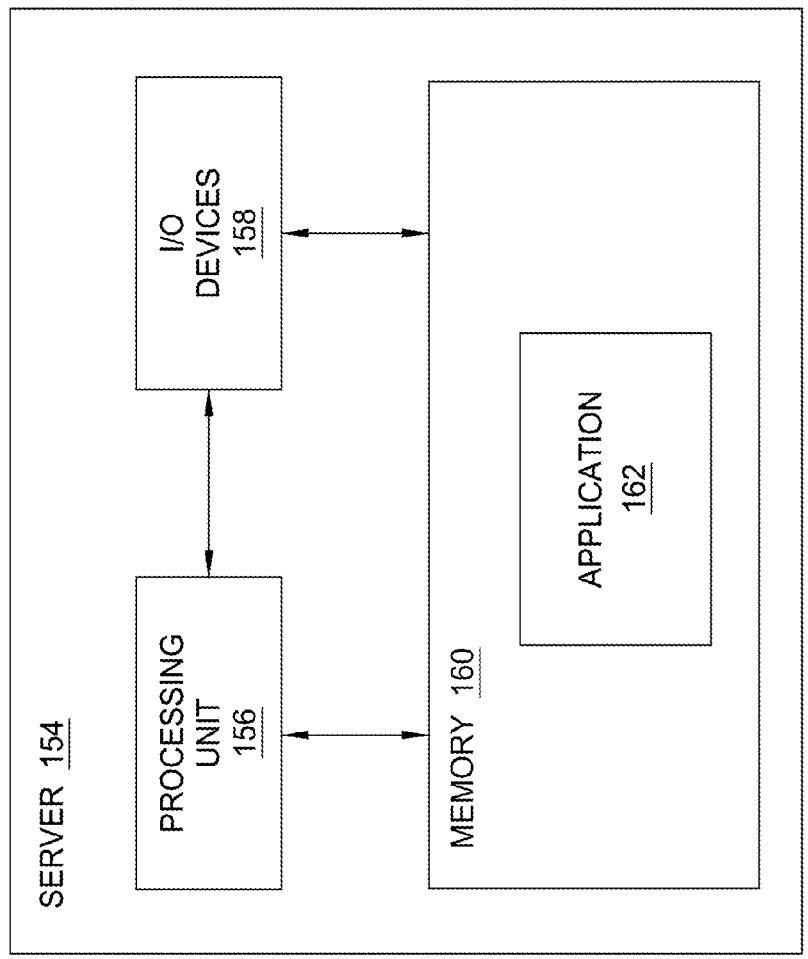
FIG. 1B is a block diagram illustrating the server of FIG. 1A, according to one embodiment of the invention.

FIG. 1B is a block diagram 170 of server 154, according to one embodiment of the invention. In this particular embodiment, server 154 comprises a computing device capable of processing data by executing program instructions stored in memory. Server 154 may also comprise any type of machine capable of processing data. As shown, server 154 includes, without limitation, a processing unit 156, input/output (I/O) devices 158, and memory 160. As also shown, processing unit 156, I/O devices 158, and memory 160 are coupled to one another.

Processing unit 156 may include one or more central processing unit (CPUs), parallel processing units (PPUs), graphics processing units (GPUs), application-specific integrated circuits (ASICs), field-programmable gate arrays (FPGAs), or any other type of processing unit capable of processing data. In addition, processing unit 156 may include various combinations of processing units, such as, e.g., a CPU coupled to a GPU.

I/O devices 158 may include input devices, such as a keyboard, a mouse, a touchpad, a microphone, a video camera, and so forth, as well as output devices, such as a screen, a speaker, a printer, a projector, and so forth. In addition, I/O devices 158 may include devices capable of performing both input and output operations, such as a touch screen, an Ethernet port, a universal serial bus (USB) port, a serial port, etc. I/O devices 158, as well as processing unit 156 described above, are both configured to read data from and write data to memory 160.

Memory 160 may include a hard disk, one or more random access memory (RAM) modules, a database, and so forth. In general, memory 160 may be implemented by any technically feasible unit capable of storing data. Memory 160 includes an application 162 that may be executed by processing unit 156 to perform the various functions of server 154 described herein. Persons skilled in the art will recognize that block diagram 170 illustrates just one possible implementation of server 154, and that any system or combination of systems configured to perform the functionality of server 154 described herein falls within the scope of the present invention.

Referring back now to FIG. 1A, the techniques described herein are sufficiently flexible to be utilized within any technically feasible network environment including, without limitation, a wide-area network (WAN) or a local-area network (LAN). Moreover, multiple network types may exist within a given network system 100. For example, communications between two nodes 130 or between a node 130 and the corresponding access point 150 may be via a radio-frequency local-area network (RF LAN), while communications between access points 150 and the network may be via a WAN such as a general packet radio service (GPRS). As mentioned above, each node within wireless mesh network 102 includes a network interface that enables the node to communicate wirelessly with other nodes. Each node 130 may implement the first and/or second embodiments of the invention, as described above, by operation of the network interface. An exemplary network interface is described below in conjunction with FIG. 2.

Figure 2:
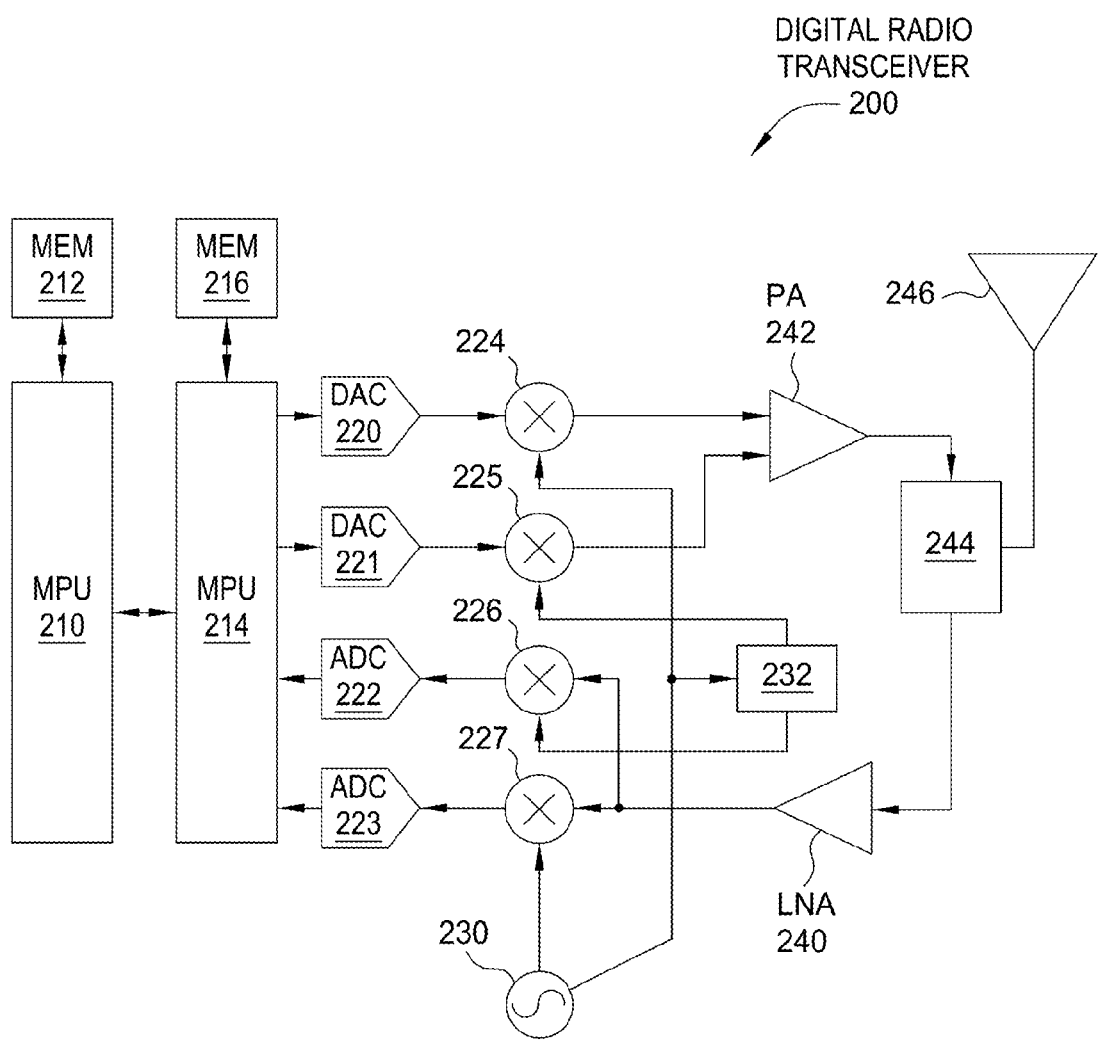
FIG. 2 illustrates a network interface configured to transmit and receive data within a mesh network, according to one embodiment of the invention.

FIG. 2 illustrates a network interface 200 configured to implement multi-channel operation, according to one embodiment of the invention. Each node 110, 112, 130 within the wireless mesh network 102 of FIG. 1 includes at least one instance of the network interface 200. The network interface 200 may include, without limitation, a microprocessor unit (MPU) 210, a digital signal processor (DSP) 214, digital to analog converters (DACs) 220, 221, analog to digital converters (ADCs) 222, 223, analog mixers 224, 225, 226, 227, a phase shifter 232, an oscillator 230, a power amplifier (PA) 242, a low noise amplifier (LNA) 240, an antenna switch 244, and an antenna 246. A memory 212 may be coupled to the MPU 210 for local program and data storage. Similarly, a memory 216 may be coupled to the DSP 214 for local program and data storage. Memory 212 and/or memory 216 may be used to store data structures such as, e.g., a forwarding database, and/or routing tables that include primary and secondary path information, path cost values, and so forth.

In one embodiment, the MPU 210 implements procedures for processing IP packets transmitted or received as payload data by the network interface 200. The procedures for processing the IP packets may include, without limitation, wireless routing, encryption, authentication, protocol translation, and routing between and among different wireless and wired network ports. In one embodiment, MPU 210 implements the techniques performed by the node, as described in conjunction with FIGS. 1 and 3-7, when MPU 210 executes a firmware program stored in memory within network interface 200.

The DSP 214 is coupled to DAC 220 and DAC 221. Each DAC 220, 221 is configured to convert a stream of outbound digital values into a corresponding analog signal. The outbound digital values are computed by the signal processing procedures for modulating one or more channels. The DSP 214 is also coupled to ADC 222 and ADC 223. Each ADC 222, 223 is configured to sample and quantize an analog signal to generate a stream of inbound digital values. The inbound digital values are processed by the signal processing procedures to demodulate and extract payload data from the inbound digital values. Persons having ordinary skill in the art will recognize that network interface 200 represents just one possible network interface that may be implemented within wireless mesh network 102 shown in FIG. 1, and that any other technically feasible device for transmitting and receiving data may be incorporated within any of the nodes within wireless mesh network 102.

Figure 3:
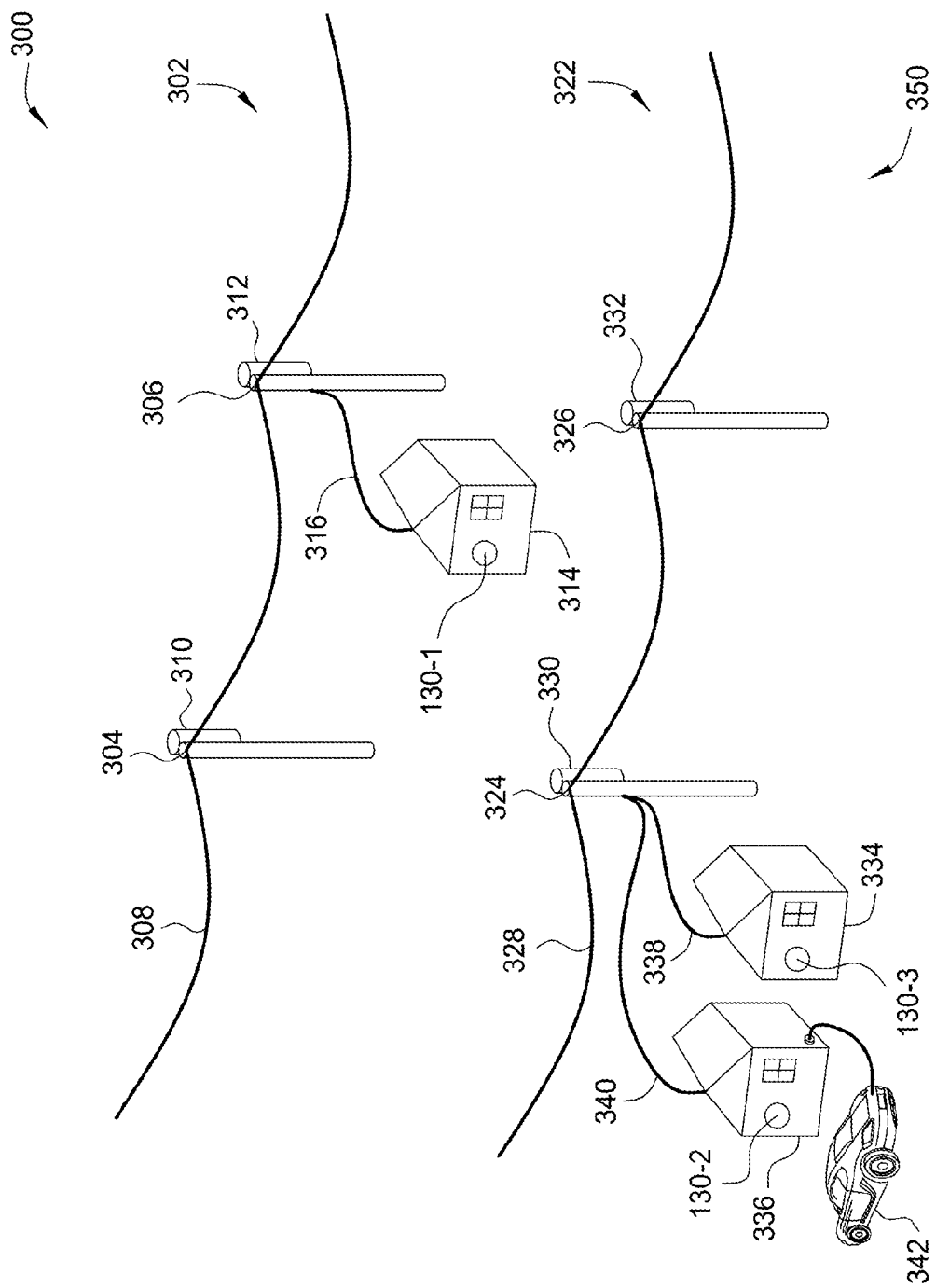
FIG. 3 is a conceptual diagram that illustrates a power grid topology, according to one embodiment of the invention.

FIG. 3 is a conceptual diagram 300 that illustrates a power grid topology 350, according to one embodiment of the invention. Power grid topology 350 represents a mapping between transformers and power consumers coupled to those transformers within a power grid. As shown, power grid topology 350 includes topology subdivisions 302 and 322. Topology subdivision 302 includes utility poles 304 and 306 that are configured to physically support power transmission lines 308. Power transmission lines 308 are configured to conduct medium-voltage power from an upstream power sub-station (not shown). Utility poles 304 and 306 include transformers 310 and 312, respectively, which are coupled to power transmissions lines 308 and configured to step down medium voltage power conducted through power transmission lines 308 to a lower voltage.

Transformer 312 is coupled to residence 314 via secondary line 316 and configured to provide low voltage power to residence 314. Residence 314 could be a house or apartment building, among other types of residences, or could be a business or other commercial entity. Those skilled in the art will understand that residence 314 represents just one type of power consumer, and that any other type of power consumer is equally applicable to the present invention. Residence 314 includes a node 130-1 that resides within wireless mesh network 102 shown in FIG. 1.

Like topology subdivision 302, topology subdivision 322 includes utility poles 324 and 326 that are configured to physically support power transmission lines 328. Power transmission lines 328 are configured to conduct medium-voltage power from an upstream power sub-station (not shown). Utility poles 324 and 326 include transformers 330 and 332, respectively, which are coupled to power transmissions lines 328 and configured to step down medium voltage power conducted through power transmission lines 328 to a lower voltage.

Transformer 330 is coupled to residences 334 and 336 via secondary lines 338 and 340, respectively, and configured to provide low voltage power to those residences. Residences 334 and 336 may be substantially similar to residence 314 residing within topology subdivision 302. An electric vehicle 342 is coupled to residence 336 and may draw power from residence 336. Residences 334 and 336 include nodes 130-2 and 130-3, respectively, that reside within wireless mesh network 102 shown in FIG. 1.

A given node 130 residing within a residence is associated with a particular transformer and is configured to measure the voltage supplied by that transformer to the residence and to measure the power consumed by that residence, among other quantities related to electric power. For example, node 130-1 is configured to measure the voltage supplied by transformer 312 to residence 316, while nodes 130-2 and 130-3 are configured to measure the voltage supplied by transformer 330 to residences 334 and 336, respectively.

Each node 130 is also configured to detect and classify fluctuations in the voltage supplied by the corresponding transformer and/or other measurable quantities related to electric power. These fluctuations may include events known colloquially in the power industry as "bumps", "blips", "winks", "blinks", "sags", and "swells", among other types of events. When any two nodes detect a given type of event at approximately the same time, then those two nodes may be coupled to the same transformer, variable loads on that transformer being responsible for the detected event.

Each node 130 is configured to detect and classify such events and then generate a time-stamped event classification. A given node 130 then transmits the time-stamped event classification to server 154 for further processing. Server 154 is a machine configured to analyze time-stamped event classifications and compute correlation values between all such time-stamped event classifications. When server 154 determines that two nodes 130 detected an event at approximately the same time, and further determines that the two nodes 130 provided the same classification for the event, server 154 may determine that those two nodes 130 observed the same event. Thus, both nodes 130 may be coupled to the same transformer. By iteratively performing this technique for all time-stamped event classifications, within a given time period, server 154 may determine the set of nodes 130 that are coupled to each different transformer. Accordingly, server 154 may determine which residences reside on the secondary side of each transformer, thereby providing a complete topology for the power grid.

For example, when electric vehicle 342 is initially coupled to a power source at residence 336 (i.e. electric vehicle 342 is "plugged in"), the voltage supplied by transformer 330 may dip momentarily as electric vehicle 342 begins to draw power. Node 130-2 may detect and classify that dip, then transmit a time-stamped event classification to server 154 reflecting that the dip happened at a particular time. Likewise, node 130-3 within residence 334 may also detect and classify that dip, then transmit a similar time-stamped event classification to server 154 also reflecting that the dip happened at a particular time. Node 130-1 may not detect the dip since that node is coupled to a different transformer than nodes 130-2 and 130-3. Accordingly, no such event may be detected by node 130-1. Server 154 is configured to determine that, since nodes 130-2 and 130-3 both detected the same event at approximately the same time, those two nodes are likely coupled to the same transformer. This example is discussed in greater detail below in conjunction with FIG. 4.

Figure 4:
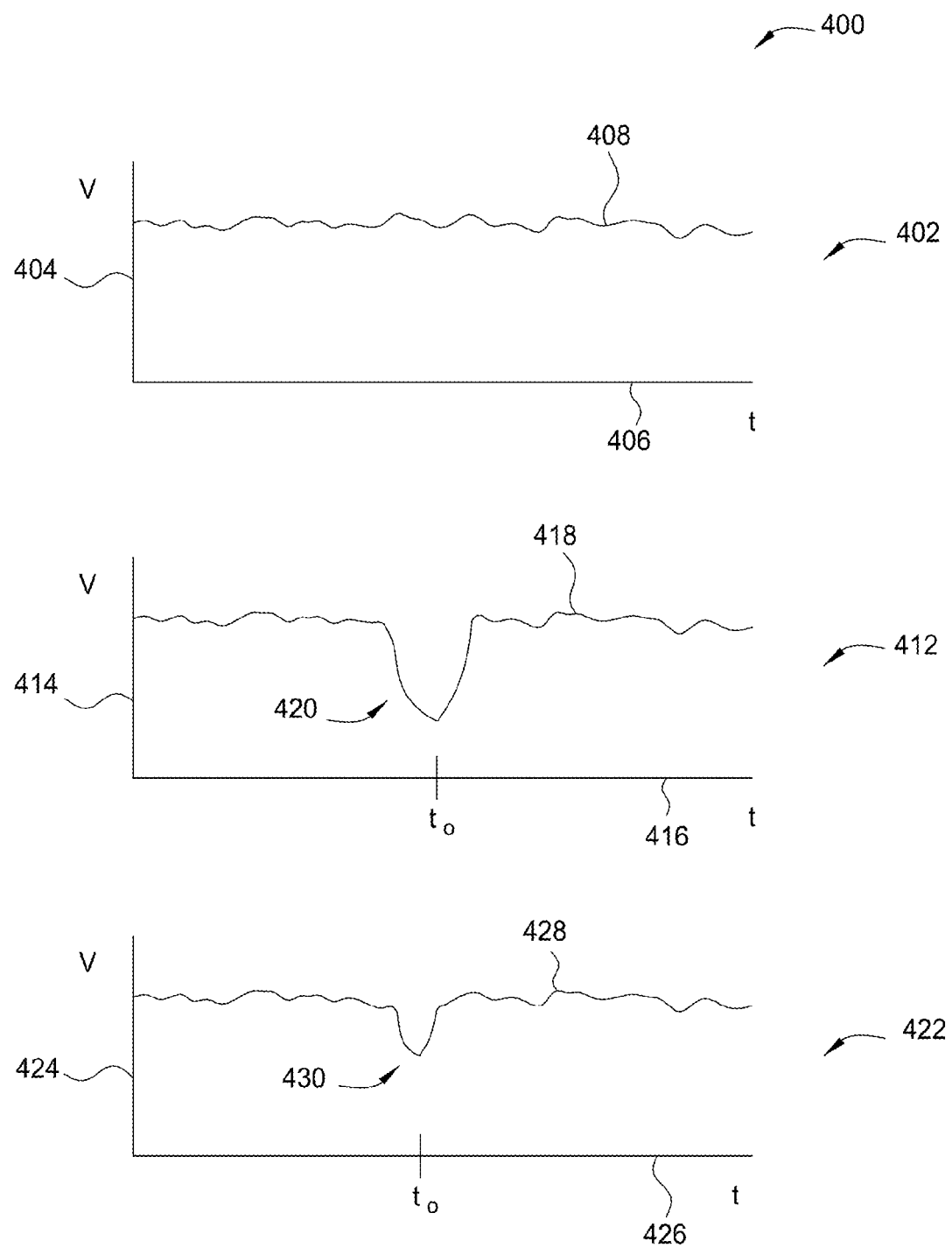
FIG. 4 is a conceptual diagram that illustrates a set of graphs reflecting voltage levels within the power grid topology of FIG. 3, according to one embodiment of the invention.

FIG. 4 is a conceptual diagram 400 that illustrates a set of graphs 402, 412, and 422 each reflecting voltage levels within the power grid topology 350 of FIG. 3, according to one embodiment of the invention. Graph 402 represents voltage levels detected by node 130-1 when electric vehicle 342 is coupled to the power source at residence 336 (i.e. electric vehicle 342 is "plugged in"). Graph 402 includes voltage axis 404, time axis 406, and voltage level 408. Graph 412 represents voltage levels detected by node 130-2 when electric vehicle 342 is coupled to the power source at residence 336 and includes voltage axis 414, time axis 416, voltage level 418, and voltage dip 420, while graph 422 represents voltage levels detected by node 130-3 when electric vehicle 342 is coupled to the power source at residence 336 and includes voltage axis 424, time axis 426, voltage level 428, and voltage dip 430.

As is shown, when electric vehicle 342 is coupled to the power source at residence 336, nodes 130-2 and 130-3 detect voltage dips 420 and 430, respectively, at time t0. However, node 130-1 detects no such voltage dip. Nodes 130-2 and 130-3 are configured to generate time-stamped event classifications based on observing dips 420 and 430, and to then transmit those time-stamped event classifications to server 154. As discussed above, server 154 may then correlate such time-stamped event classifications in order to determine that nodes 130-2 and 13-3 are both coupled to the same transformer. Through this technique, a topology of the power grid may be generated.

In one embodiment, a given node 130 may transmit a time-stamped voltage sample to server 154. The time-stamped voltage sample may represent a voltage level measured by the node 130, such as voltage level 408, 418, or 428. Server 154 may then perform an event classification routine using time-stamped voltage levels received from various nodes 130. In various other embodiments, each node 130 performs measurements and/or event detection and classification based on current levels, frequency levels, power levels, and/or any other measurable quantity associated with electric power and/or power transmission lines. In such embodiments, each node 130 may perform any of the techniques described thus far based on any of those measurable quantities.

Figure 5:
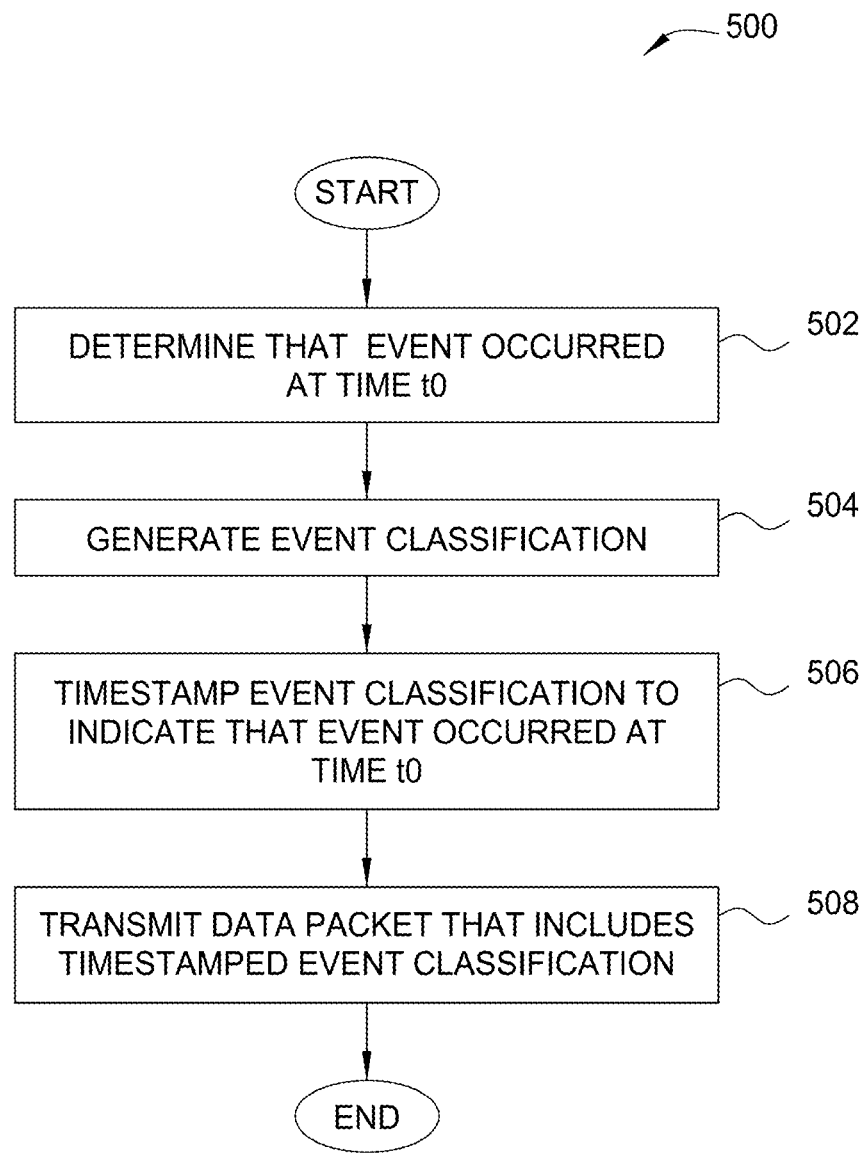
FIG. 5 is a flowchart of method steps for generating a time-stamped event classification, according to one embodiment of the invention.

FIG. 5 is a flowchart of method steps for generating a time-stamped event classification, according to one embodiment of the invention. Although the method steps are described in conjunction with the systems of FIGS. 1-2, persons skilled in the art will understand that any system configured to perform the method steps, in any order, is within the scope of the present invention.

As shown, a method 500 starts at step 502, where a node 130 located at a residence and coupled to a transformer determines that an event occurred at time t0. An event may generally correspond to a voltage fluctuation, and may specifically be a voltage spike, dip, "wink", "blink", and so forth. In one embodiment, node 130 measures current, frequency, and/or power levels, and determines that an event occurred based on measuring any of those quantities.

At step 504, node 130 generates an event classification by classifying the event as a voltage spike, dip, etc. At step 506, node 130 timestamps the event classification to indicate that the event occurred at time t0. At step 508, node 130 transmits a data packet to server 154 that includes the timestamped event classification. The method 500 then ends.

All nodes 130 within the wireless mesh network 102 may perform the method 500 multiple times and on an ongoing basis, thereby transmitting multiple timestamped event classifications to server 154. Server 154 is configured to process all such timestamped event classifications in order to determine the topology of the power grid, as described in greater detail below in conjunction with FIG. 6.

Figure 6:
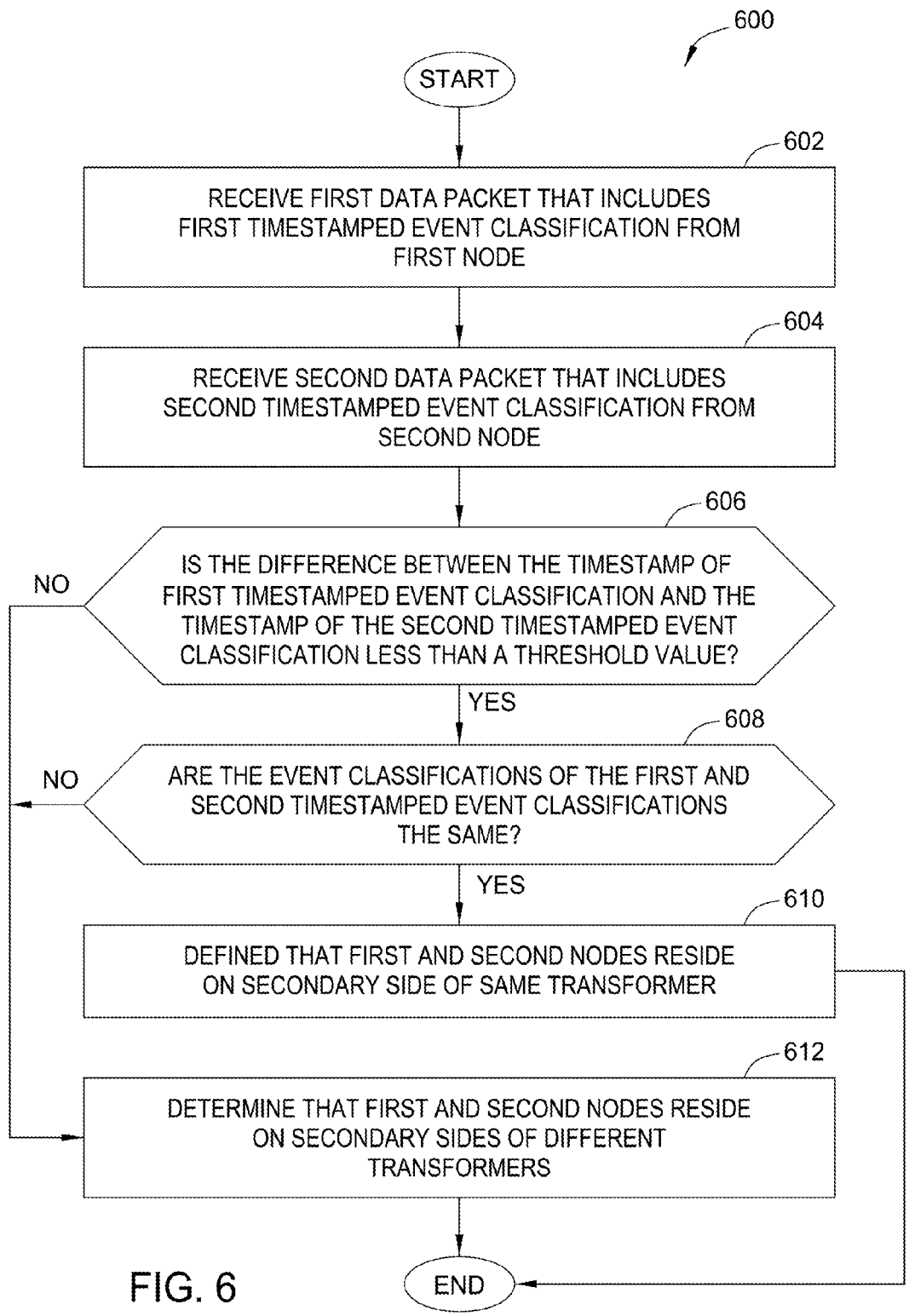
FIG. 6 is a flowchart of method steps for determining a power grid topology, according to one embodiment of the invention.

FIG. 6 is a flowchart of method steps for determining a power grid topology, according to one embodiment of the invention. Although the method steps are described in conjunction with the systems of FIGS. 1A-2, persons skilled in the art will understand that any system configured to perform the method steps, in any order, is within the scope of the present invention.

As shown, a method 600 starts at step 602, where server 154 receives a first data packet from a first node that includes a first timestamped event classification. At step 604, server 154 receives a second data packet from a second node that includes a second timestamped event classification. At step 606, server 154 determines whether the difference between the timestamp of the first timestamped event classification and the timestamp of the second event classification is less than a threshold value. In other words, server 154 determines at step 606 whether the first and second timestamped event classifications have approximately the same timestamp.

If server 154 determines that the difference between the timestamp of the first timestamped event classification and the timestamp of the second event classification is not less than the threshold value, then the method 600 proceeds to step 612. At step 612, server 154 determines that the first and second node reside on secondary sides of different transformers.

At step 606, if server 154 determines that the difference between the timestamp of the first timestamped event classification and the timestamp of the second event classification is less than the threshold value, then the method 600 proceeds to step 608. At step 608, server 154 determines whether the event classifications of the first and second timestamped even classifications are the same. For example, server 154 may determine whether the first and second timestamped event classifications both indicate that a "wink" occurred. If server 154 determines that the event classifications of the first and second timestamped event classifications are not the same, then the method 600 proceeds to step 612 and proceeds as described above.

If server 154 determines that the event classifications of the first and second timestamped event classifications are the same, then the method 600 proceeds to step 610, where server 154 determines that the first and second node reside on the secondary side of the same transformer. The method 600 then ends.

The method 600 may be repeated for all combinations of timestamped event classifications received by server 154 within any time period. By performing the method 600 iteratively with all such combinations, server 154 is capable of determining the set of nodes 130 residing on the secondary side of each transformer in the power grid.

In sum, a wireless mesh network is configured to manage a power grid. Each node within the wireless mesh network is configured to detect and classify voltage fluctuations in power supplied by an upstream transformer coupled to the power grid. When a given node detects a particular type of fluctuation (i.e., an "event"), the node generates a timestamped event classification that reflects the type of event and a time when the event occurred. A server configured to manage the wireless mesh network receives timestamped event classifications from each node within the wireless mesh network and then performs a time correlation with the received timestamped event classifications to determine which nodes detected similar events. When two or more nodes detected the same event at similar times, the server determines that those nodes are coupled to the same transformer.

Advantageously, power grid topology can be reliably determined regardless of the distance between each power consumer and an upstream transformer. Accordingly, safety issues related to inaccurate power grid topology may be circumvented.

While the foregoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

In view of the foregoing, the scope of the present invention is determined by the claims that follow.

The invention claimed is:

1. A computer-implemented method for determining a topology of a power grid, the method comprising:
   receiving a first timestamped event classification from a first node residing within a network of nodes, wherein the first timestamped event classification reflects an event within the power grid detected by the first node;
   receiving a second timestamped event classification from a second node residing within the network of nodes, wherein the second timestamped event classification reflects an event within the power grid detected by the second node;
   determining, via a processor, that the first timestamped event classification and the second timestamped event classification are correlated with one another; and
   determining that the first node and the second node are both coupled to a particular transformer within the power grid based on the first timestamped event classification and the second timestamped event classification being correlated with one another.

2. The computer-implemented method of claim 1, wherein determining that the first timestamped event classification and the second timestamped event classification are correlated with one another comprises:
   determining that a timestamp associated with the first timestamped event classification is substantially similar to a timestamp associated with the second timestamped event classification; and
   determining that an event classification indicated by the first timestamped event classification is equivalent to an event classification indicated by the second timestamped event classification.

3. The computer-implemented method of claim 1, wherein the first node is configured to:
   detect that a first characteristic fluctuation occurred in a power source measured by the first node;
   generate a first event classification by classifying the first characteristic fluctuation as a first event;
   generate the first timestamped event classification by updating the first event classification to reflect a time when the first characteristic fluctuation occurred; and
   transmit the first timestamped event classification to a server machine.

4. The computer-implemented method of claim 3, wherein the second node is configured to:
   detect that a second characteristic fluctuation occurred in a power source measured by the second node;
   generate a second event classification by classifying the second characteristic fluctuation as a second event;
   generate the second timestamped event classification by updating the second event classification to reflect a time when the second characteristic fluctuation occurred; and
   transmit the second timestamped event classification to the server machine.

5. The computer-implemented method of claim 4, wherein the first fluctuation in the power source measured by the first node and the second fluctuation in the power source measured by the second node are both derived from a fluctuation in power provided the particular transformer within the power grid.

6. The computer implemented method of claim 5, wherein the fluctuation in power provided by the particular transformer within the power grid corresponds to a voltage fluctuation, a current fluctuation, or a frequency fluctuation caused by a draw of power from the particular transformer.

7. The computer-implemented method of claim 1, further comprising:
receiving a third timestamped event classification from a third node residing within the network of nodes, wherein the third timestamped event classification reflects an event within the power grid detected by the third node;
determining that the third timestamped event classification is not correlated with either the first timestamped event classification or the second timestamped event classification; and
determining that the third node is coupled to a different transformer within the power grid than the particular transformer to which the first and second nodes is coupled based on the third timestamped event classification not being correlated with either the first timestamped event classification or the second timestamped event classification.

8. The computer-implemented method of claim 1, wherein the network of nodes comprises a wireless mesh network, and each node within the wireless mesh network is configured to transmit timestamped event classifications to a server machine configured to determine the topology of the power grid by determining time correlations among different timestamped event classifications.

9. A non-transitory computer-readable medium storing program instructions that, when executed by a processing unit, cause the processing unit to determine a topology of a power grid by performing the steps of:
receiving a first timestamped event classification from a first node residing within a network of nodes, wherein the first timestamped event classification reflects an event within the power grid detected by the first node;
receiving a second timestamped event classification from a second node residing within the network of nodes, wherein the second timestamped event classification reflects an event within the power grid detected by the second node;
determining that the first timestamped event classification and the second timestamped event classification are correlated with one another; and
determining that the first node and the second node are both coupled to a particular transformer within the power grid based on the first timestamped event classification and the second timestamped event classification being correlated with one another.

10. The non-transitory computer-readable medium of claim 9, wherein the step of determining that the first timestamped event classification and the second timestamped event classification are correlated with one another comprises:
determining that a timestamp associated with the first timestamped event classification is substantially similar to a timestamp associated with the second timestamped event classification; and
determining that an event classification indicated by the first timestamped event classification is equivalent to an event classification indicated by the second timestamped event classification.

11. The non-transitory computer-readable medium of claim 9, wherein the first node is configured to:
detect that a first characteristic fluctuation occurred in a power source measured by the first node;
generate a first event classification by classifying the first characteristic fluctuation as a first event;
generate the first timestamped event classification by updating the first event classification to reflect a time when the first characteristic fluctuation occurred; and
transmit the first timestamped event classification to a server machine.

12. The non-transitory computer-readable medium of claim 11, wherein the second node is configured to:
detect that a second characteristic fluctuation occurred in a power source measured by the second node;
generate a second event classification by classifying the second characteristic fluctuation as a second event;
generate the second timestamped event classification by updating the second event classification to reflect a time when the second characteristic fluctuation occurred; and
transmit the second timestamped event classification to the server machine.

13. The non-transitory computer-readable medium of claim 12, wherein the first fluctuation in the power source measured by the first node and the second fluctuation in the power source measured by the second node are both derived from a fluctuation in power provided the particular transformer within the power grid.

14. The non-transitory computer-readable medium of claim 13, wherein the fluctuation in power provided by the particular transformer within the power grid corresponds to a voltage fluctuation, a current fluctuation, or a frequency fluctuation caused by a draw of power from the particular transformer.

15. The non-transitory computer-readable medium of claim 9, further comprising the steps of:
receiving a third timestamped event classification from a third node residing within the network of nodes, wherein the third timestamped event classification reflects an event within the power grid detected by the third node;
determining that the third timestamped event classification is not correlated with either the first timestamped event classification or the second timestamped event classification; and
determining that the third node is coupled to a different transformer within the power grid than the particular transformer to which the first and second nodes is coupled based on the third timestamped event classification not being correlated with either the first timestamped event classification or the second timestamped event classification.

16. The non-transitory computer-readable medium of claim 9, wherein the network of nodes comprises a wireless mesh network, and each node within the wireless mesh network is configured to transmit timestamped event classifications to a server machine configured to determine the topology of the power grid by determining time correlations among different timestamped event classifications.

17. A computing device configured to determine a topology of a power grid, including:
a processing unit configured to:
receive a first timestamped event classification from a first node residing within a network of nodes, wherein the first timestamped event classification reflects an event within the power grid detected by the first node,
receive a second timestamped event classification from a second node residing within the network of nodes, wherein the second timestamped event classification reflects an event within the power grid detected by the second node,
determine that the first timestamped event classification and the second timestamped event classification are correlated with one another, and determine that the first node and the second node are both coupled to a particular transformer within the power grid based on the first timestamped event classification and the second timestamped event classification being correlated with one another.

18. The computing device of claim 17, further including:
a memory module coupled to the processing unit and storing program instructions that, when executed by the processing unit, cause the processing unit to:
receive the first timestamped event classification from the first node residing within the network of nodes,
receive the second timestamped event classification from the second node residing within the network of nodes,
determine that the first timestamped event classification and the second timestamped event classification are correlated with one another, and
determine that the first node and the second node are both coupled to the particular transformer within the power grid.

19. The computing device of claim 17, wherein the processing unit is configured to determine that the first timestamped event classification and the second timestamped event classification are correlated with one another by:
determining that a timestamp associated with the first timestamped event classification is substantially similar to a timestamp associated with the second timestamped event classification; and
determining that an event classification indicated by the first timestamped event classification is equivalent to an event classification indicated by the second timestamped event classification.

20. The computing device of claim 17, wherein the network of nodes comprises a wireless mesh network, and each node within the wireless mesh network is configured to transmit timestamped event classifications to a server machine configured to determine the topology of the power grid by determining time correlations among different timestamped event classifications.

\* \* \* \* \*